United States Patent
Bohmer et al.

(10) Patent No.: US 6,759,736 B2
(45) Date of Patent: Jul. 6, 2004

(54) SEMICONDUCTOR DEVICE COMPRISING A SECURITY COATING AND SMARTCARD PROVIDED WITH SUCH A DEVICE

(75) Inventors: Marcel René Bohmer, Eindhoven (NL); Nicolaas Kooyman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/730,656

(22) Filed: Dec. 6, 2000

(65) Prior Publication Data

US 2001/0003374 A1 Jun. 14, 2001

(30) Foreign Application Priority Data

Dec. 9, 1999 (EP) .............................................. 99204177

(51) Int. Cl.[7] .............................................. H01L 23/02
(52) U.S. Cl. ........................ 257/679; 257/729; 257/795
(58) Field of Search ................................ 257/117, 578, 257/629, 646, 679, 736, 741, 746, 751, 760, 767, 795, 926, 922, 789, 729; 428/689; 438/760, 125; 361/737

(56) References Cited

U.S. PATENT DOCUMENTS

| | | | | |
|---|---|---|---|---|
| 4,243,427 A | * | 1/1981 | DiBufnara | ............. 106/287.16 |
| 5,053,992 A | * | 10/1991 | Gilberg et al. | ................ 365/53 |
| 5,258,334 A | * | 11/1993 | Lantz | ......................... 437/238 |
| 5,399,441 A | | 3/1995 | Bearinger et al. | |
| 5,892,661 A | * | 4/1999 | Stafford et al. | ............. 361/737 |
| 5,916,944 A | * | 6/1999 | Camiletti et al. | ........... 524/394 |
| 6,144,106 A | * | 11/2000 | Bearinger et al. | .......... 257/789 |
| 6,198,155 B1 | * | 3/2001 | Verhaegh et al. | ........... 257/588 |
| 2002/0033486 A1 | * | 3/2002 | Kim et al. | ................... 257/118 |

FOREIGN PATENT DOCUMENTS

WO            98/22905         5/1998

OTHER PUBLICATIONS

Laura Peters. Sep., 1998. Semiconductor International. Pursuing the Perfect Low-k Dielectric.*

* cited by examiner

Primary Examiner—Eddie Lee
Assistant Examiner—Douglas W Owens
(74) Attorney, Agent, or Firm—Peter Zawilski

(57) ABSTRACT

A semiconductor device (20) comprising a substrate (1) is provided with a first semiconductor element (3) on a first side (2), of the substrate and with a security coating (14) comprising a matrix, a first filler and a second filler. The second filler is an absorber of radiation of a wavelength of between 800 and 1400 nm and the refractive index of the first filler differs at least 0.3 from that of the matrix. As a result, the security coating inhibits transmission of radiation with a wavelength of between 400 and 1400 nm to a very large extent. The semiconductor device (20) can be incorporated in a smartcard.

8 Claims, 2 Drawing Sheets

SEMICONDUCTOR DEVICE COMPRISING A SECURITY COATING AND SMARTCARD PROVIDED WITH SUCH A DEVICE

BACKGROUND OF THE INVENTION

The invention relates to a semiconductor device having a substrate on a first side of which there are provided a first semiconductor element and at least one security coating which comprises a powdery filler incorporated in a matrix.

The invention also relates to a smartcard provided with a semiconductor device comprising a memory and a security coating which comprises a powdery first filler incorporated in a matrix.

U.S. Pat. No. 5,399,441 discloses a semiconductor device of the type mentioned in the opening paragraph wherein the security coating is a layer having a matrix of silicon oxide in which a powdery filler is incorporated. When the matrix is filled with a filler, such as an oxide, a nitride or a carbide of silicon, aluminum or a metal, the coating inhibits at least 90% of the transmission of visible light. When the matrix is filled with an inorganic salt of a heavy metal, the coating inhibits at least 90% of the transmission of a specific type of infrared radiation.

It is a drawback of the known semiconductor device that about 10% of the radiation of selected wavelengths is still transmitted through the coating. Considering that state-of-the art microscopes operate with visible light or near infrared radiation, this percentage is too high to provide adequate security. Personal or financial data contained in the known semiconductor device will be accessible and a method to change the data illegally might be found by reverse engineering of the semiconductor device. So if the known semiconductor device is applied in a smartcard and if the smart card falls into the hands of a dishonest person, the data therein will be vulnerable to a breach of security.

SUMMARY OF THE INVENTION

It is, therefore, a first object of the invention to provide a semiconductor device of the type mentioned in the opening paragraph wherein the coating inhibits transmission of visible light and of near infrared radiation to a larger extent. It is a second object to provide a smart card of the type mentioned in the opening paragraph whose semiconductor device has such an improved coating.

The first object is achieved in that:
the difference between the refractive index of the powdery first filler and that of the matrix is at least 0.3, and
the coating comprises a second filler which is a substantial absorber of radiation of wavelengths at least in the range of from 800 to 1400 nm and is free of heavy metals.

The second filler is a material, for example, in the form of particles which transforms incident radiation into heat. As a substantial absorber of radiation, it absorbs the radiation for at least 99 percent. The second filler absorbs the radiation to at least 1400 nm. Radiation of a wavelength larger than 1.4 $\mu$m need not be absorbed as much as 99%, as the large wavelength itself hides details of the first semiconductor element in the semiconductor device of the invention. Preferably, the second filler absorbs the radiation of wavelengths in the range of from 800 to 2000 nm. Suitable materials are, for instance, titanium nitride and titanium oxynitride.

The second filler in a preferred embodiment comprises titanium nitride. Due to the use of titanium nitride as a second filler, of the transmittance of at least 99.9% of radiation of a wavelength of between 600 and 2000 nm can be easily inhibited. The inventors have found that particles of TiN in the coating can have a surface comprising $TiO_2$, which is believed to follow from accidental oxidation. Such oxidation occurs, for example, when the security coating is applied during the manufacture of the semiconductor device from an acid, aqueous composition.

A first advantage of this second filler is that titanium nitride is known to be used in the manufacture of semiconductor devices in cleanroom facilities. Moreover, it is free of heavy metals. This is an important advantage as heavy metals are poisonous materials that present problems both during the production and as waste after disposal of the semiconductor device comprising the security coating. A further advantage is that titanium nitride is commercially available in various particle sizes.

The first filler present in the security coating of the device of the invention operates by scattering visible light. Radiation in the visible spectrum as well as in the ultraviolet spectrum is thus inhibited from penetrating by scattered reflection. In order to ensure that the coating has sufficient scattering potential, it was found that the difference between the refractive index of the first filler and that of the matrix should at least be 0.3. As the refractive index of a matrix is generally of the order of 1.4–1.5, first fillers with a refractive index larger than 1.7–1.8 can be used. Examples of such first fillers include oxides of zirconium, titanium, zinc, manganese, chromium, niobium, iron, nickel, strontium, yttrium, vanadium, gallium, copper and cobalt and nitrides of niobium, titanium and zirconium.

The first filler in a further embodiment comprises titanium oxide. This material has a very high refractive index and causes, therefore, intense scattering of visible light and of radiation in the ultraviolet spectrum. If titanium nitride is used as the second filler, it is preferred to have a weight ratio of titanium oxide and titanium nitride in the range of from 0.25 to 4 in the coating.

The amount of filler used in the coating of the semiconductor device of the present invention can be varied over a wide range, depending, for example, on the electrical characteristics desired in the coating. Generally speaking, the first and the second filler are present in a combined amount in the range of from 10 to 90 percent by weight of the coating. The first and the second filler are preferably present as particles of a size in the submicron range.

The material of the matrix of the coating can be chosen from several materials, such as a mono(metal)phosphate compound wherein the metal is, for example, chosen from the group of zinc and aluminum, or a component prepared from a silica precursor resin. Such matrices are described, for example, in the non-prepublished application WO IB99/01007 and in U.S. Pat. No. 5,399,441. Preferably, monoaluminum phosphate is used for the matrix. As a result of the use of this material, the security coating has a great mechanical strength and a good etching persistency. Furthermore, the coating with monoaluminum phosphate can be readily provided in a thickness ranging from 1 to 10 $\mu$m.

In a preferred embodiment the coating has a thickness in the range of from 1 to 5 $\mu$m. It is especially preferred to have a coating thickness of less than 3 $\mu$m. The coating is nevertheless opaque to visible light and near infrared radiation. A first advantage is that the thickness of the semiconductor device is only slightly increased by the provision of the security coating. This is advantageous for the use of the semiconductor device of the invention in a smartcard in which the device thickness is limited. A second advantage is that it is also possible to apply more than one coating in the semiconductor device. A third advantage is that the application of end-contacts in the manufacture of the semiconductor device is easier than in the case of coatings of larger thickness. These end-contacts can be applied by way of a method successively comprising the steps of depositing a photoresist in regions where end-contacts are desired; depositing and drying a composition comprising fillers incorporated in a matrix; removing the photoresist and the composition deposited thereon; heating so as to form the security coating; and applying an electrically suitably conducting material, such as copper, in said regions. Using a coating thickness of less than 5 μm facilitates the removal of the photoresist and the coating deposited thereon.

If desired, other materials may also be present in the coating. For instance, an agent which modifies the surface of the fillers for better adhesion or a dispersion agent may be used.

A further embodiment of the semiconductor device of the invention comprises a light-sensitive element which is covered by the security coating and, after damaging of the security coating, reacts to exposure to visible light by inducing a permanent change of state of the element containing data to be protected. Said reaction, taking place in this embodiment after malicious damaging of the coating, can be of an electrical or chemical nature. The layout of selected parts of the semiconductor device, such as a layer comprising interconnect lines, is thus destroyed.

Another embodiment of the semiconductor device of the invention comprises a light-sensitive element and an electrically programmable element containing data to be protected, which elements are covered by the security coating and which light-sensitive element, after damaging of the coating, reacts to exposure to visible light by inducing erasure of the data to be protected and by bringing the electrically programmable element into a non-programmable state.

Said light-sensitive elements comprise, for example, resistors in combination with diodes or transistors which are coupled to an output terminal, such as an amplifier. An example of a light-sensitive element is known for EP-A 0939 933. It comprises a biasing transistor arranged to provide a bias current, a reverse biased transistor with a control electrode arranged to be reverse biased by said bias current and with a conducting electrode, and also a resistor coupled between a supply voltage and said conducting electrode. Incident visible light is detected by a voltage drop at the conducting electrode of the reverse biased transistor which can then apply a signal to the output. The output can induce the resetting of an electrically erasable programmable random-access memory known as EEPROM. The output can also induce complete writing of a one-time electrically programmable random-access memory. The complete writing causes erasure of the data to be protected.

The substrate of the semiconductor device of the invention can be made from several materials. Suitable materials are, for example, silica, alumina and a polymer material such as polyimide. There are several materials and constructions which can be used in the first semiconductor element of the semiconductor device of the invention. Known constructions are, for example, the MOS field effect transistor and the bipolar transistor. Such a construction can comprises memory units as is known per se. Known materials comprise metals, inorganic semiconductors and organic conductors and semiconductors.

By preference, the semiconductor device constitutes a vital part of a smart card, such as a cash card, a credit card or any other card. The expression "smart card" is meant to describe in general any portable apparatus which comprises a semiconductor device that contains only data which cannot be changed by the apparatus alone. Although the smart card is a card-like apparatus, at present, the introduction of contactless smartcards makes it possible to incorporate the function of the smart card into other apparatus such as, for example, an electronic diary.

The second object of the invention, discussed above, may be achieved by providing a smart card comprising a semiconductor device in accordance with the teachings of the invention. Such a smart card will then be protected against visual inspection from an unwanted outside source. Preferably such a smart card comprises a semiconductor device that includes a light-sensitive element so as to protect the memory of the smart card against visual inspection after opening of the semiconductor device.

BRIEF DESCRIPTION OF THE DRAWINGS

These and other aspects of the semiconductor device of the invention will be apparent from and elucidated, by way of example, with reference to the embodiment described hereinafter.

In the drawings.

DESCRIPTION OF THE PREFERRED EMBODIMENTS

Figure 1:
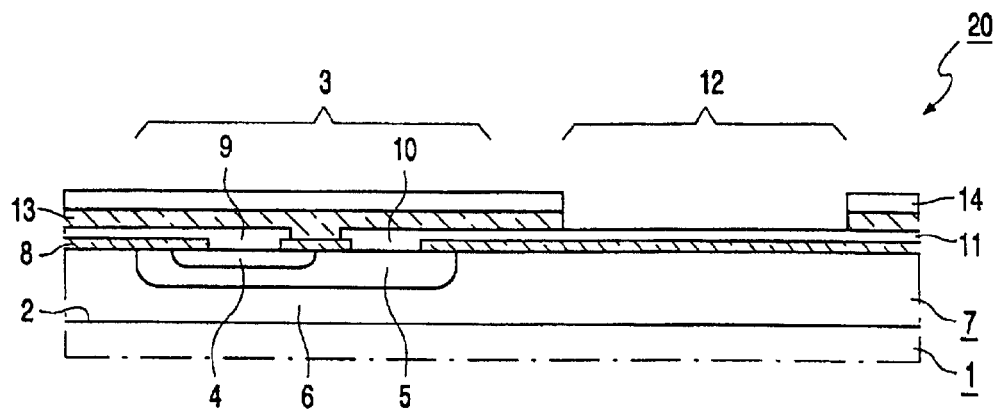
FIG. 1 is a diagrammatic, cross-sectional view of a semiconductor device in accordance with the invention.

The semiconductor device 20 in FIG. 1 has a substrate 1 of silica with a first side 2. On the first side 2 the device 20 is provided with a first semiconductor element 3 which is, in this example, a bipolar transistor with an emitter region 4, a base region 5 and a collector region 6. Said regions 4, 5 and 6 are provided in a first layer 7 which is covered with a patterned insulating layer 8 of silicon oxide. The insulating layer 8 is patterned such that it has contact windows 9 and 10 wherethrough a patterned conductive layer 11 of aluminum contacts the emitter region 4 and the base region 5. A passivation layer 13 is provided on the first side 2. This passivation layer 13 is for example a layer of silicon oxide or silicon nitride. The first side 2 is also provided with a security coating 14 according to the invention. Both the passivation layer 13 and the security coating 14 leave the conductive layer 11 exposed in the region 12, thus forming a contact face so as to enable external contact.

In order to form the region 12, the passivation layer 13 has been patterned according to a known method. Subsequently, a photoresist has been deposited onto the passivation layer 13 at desired regions. These regions comprise, for example, the region 12 and regions in which the semiconductor device 20 is separated from a neighboring device manufactured from the same slice of silicon. Such regions are commonly referred to as scribe lines.

Subsequently, a composition was prepared to spincoat on the passivation layer 13 of the substrate 1 of the semiconductor device 20. The composition comprised 50 grams of monoaluminum phosphate acidified with 50 grams of 0.01 M hydrochloric acid, a hydrolysis mixture of tetraethoxysilane (TEOS) comprising 5 grams of TEOS, 25 grams of $TiO_2$ and 25 grams of TiN. After wet ball milling overnight, the coating liquid was spincoated on the passivation layer 13 and on the conductive layer 11 which was covered by a photostructured polymer on contact faces and on sawlines. Subsequently, the coating 14 thus formed was dried at 100° C. and the photoresist was removed by means of ethanol. The monoaluminum phosphate matrix was formed next by heating the layer at a temperature in the range of from 400 to 500°.

For the sake of simplicity, only the first semiconductor element 3 is shown, but in practice the first layer 7 generally comprises a plurality of such elements and the conductive layer 11 comprises a number of layers and, in addition, is provided with many connection faces for external contact. The assembly may form an integrated circuit. As is known to those skilled in the art, field effect transistors can be present instead of or in addition to the bipolar transistor. As is also known to those skilled in the art, other elements, such as capacitors, resistors and diodes, can also be integrated in the semiconductor device 20.

Figure 2:
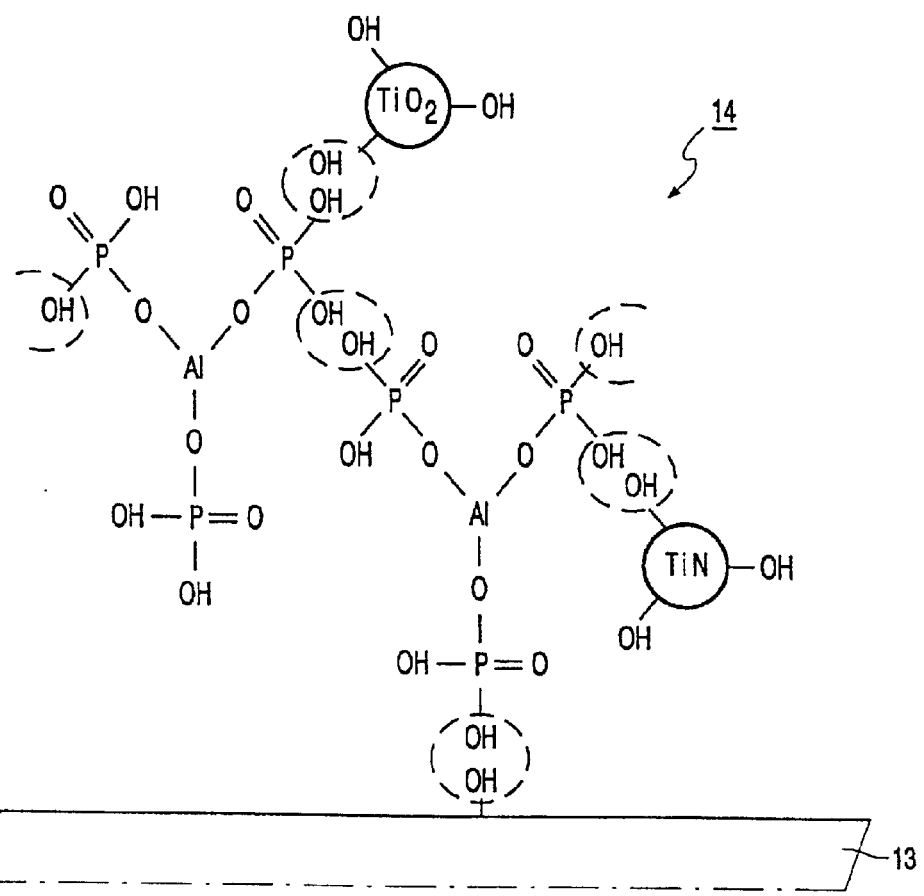
FIG. 2 shows the chemical structure of a security coating on a substrate in accordance with the invention.

In FIG. 2, a security coating 14 in accordance with the invention is provided on the passivation layer 13. The matrix of the coating 14 comprises molecules of a first material, in this case monoaluminum phosphate $Al(OPO_3H_2)_3$, which molecules are bonded to the surface of the passivation layer and to each other. The bonds are formed by condensation of hydroxyl groups. In order to clarify the molecular process of bonding, FIG. 2 shows the molecules of the matrix and the particles which act as the first or the second filler in a transition state to bonding. In this state the coating has an internal structure as in the bonded state, but no condensation has taken place yet. The encircled pairs of hydroxyl groups must be understood to change on bonding into an oxygen bond and in a liberated $H_2O$ molecule. The matrix also comprises particles of $TiO_2$ and TiN which act as the first and the second filler in the matrix. The particles preferably have an average particle size of between 50 nm and 1 $\mu$m. The TiN-particles have a oxidized surface, e.g. their surface mainly comprises $TiO_2$, and they can be bonded to the matrix as easily as the $TiO_2$-particles.

Figure 3:
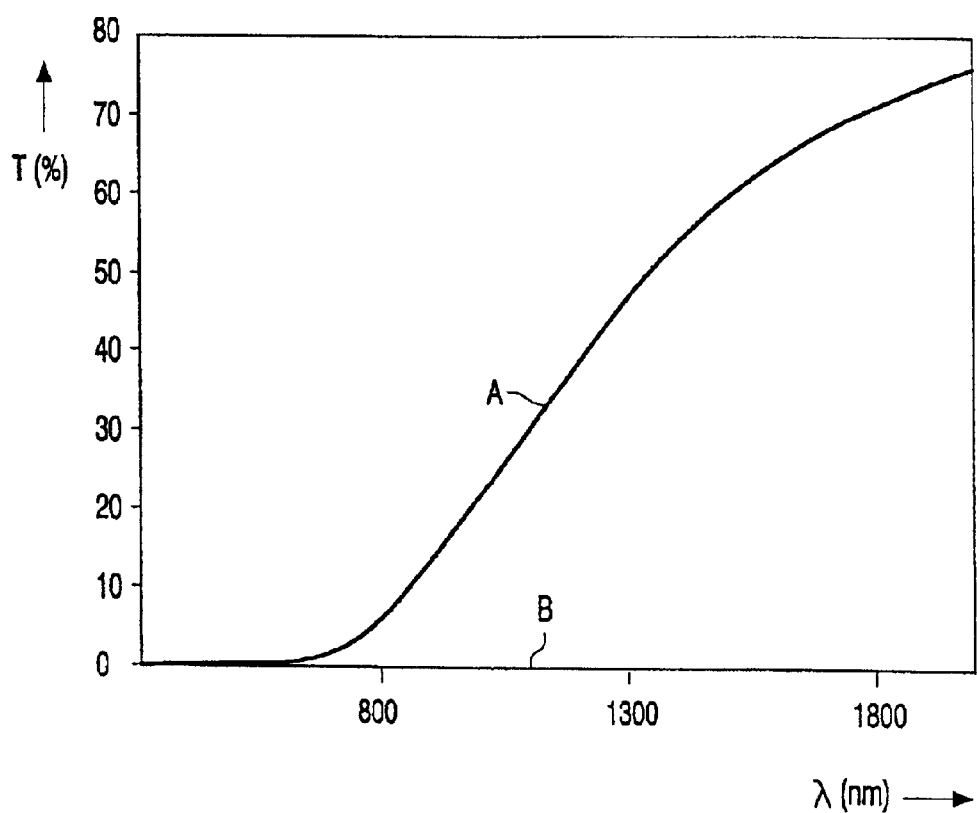
FIG. 3 shows the transmission of radiation T in % by two security coatings A and B as a function of the wavelength λ of between 400 and 2000 nm, the coating B being a coating according to the invention.

FIG. 3 shows the transmission T in % of radiation by two different security coatings A and B as a function of the wavelength $\lambda$ between 400 and 2000 nm. The first coating A, not being in conformity with the invention, consisted of about 55 weight percent of monoaluminum phosphate, about 40 weight percent of particles of $TiO_2$ as the first filler and about 5 weight percent of tetraethoxysiloxane. The coating A had a thickness of 4 $\mu$m. Whereas the transmission is very low in the range from 400 to 600 nm, the transmission increases up to 50 percent at about 1300 nm and to 75 percent at about 2000 nm.

The second line, indicated as B, shows the transmission by a security coating according to the invention, consisting of about 48 weight percent monoaluminum phosphate, about 24 weight percent of particles of $TiO_2$, about 24 weight percent of particles of TiN and about 4 weight percent of tetraethoxysiloxane. Clearly, the transmission is inhibited in the spectrum from 400 to 2000 nm for a very large part, e.g. for more than 99.99 percent. Therefore, the invention provides an excellent security coating which certainly improves the known security coating and with which data can be protected very well.

It is to be understood that the word "comprise", and its conjugations as used herein, does not exclude the presence of elements or steps other than those listed.

What is claimed is:
1. A semiconductor device comprising:
   a substrate; and
   a semiconductor element and at least one security coating provided on a first side of the substrate so as to block visual access to secure data, the at least one security coating including at least two powdery fillers incorporated in a matrix comprising about 10 to 90 percent by weight of the security coating,
   wherein a first powdery filler scatters at least visible light, and a difference between a refractive index of the first powdery filler and that of the matrix is at least 0.3, and the coating comprises a second powdery filler which is a substantial absorber of radiation and is present in an amount of about 25% of the weight of the matrix, so as to transform radiation into heat and absorb at least 99% of infrared radiation in contact therewith of wavelengths in the range of about 800 to 1400 inn and is free of heavy metals.

2. A semiconductor device as claimed in claim 1, wherein the first filler comprises $TiO_2$ and the second filler comprises TiN.

3. A semiconductor device as claimed in claim 2, wherein a weight ratio of the $TiO_2$ and TiN in the security coating ranges from about 0.25 to 4.

4. A semiconductor device as claimed in claim 1, wherein the matrix of the security coating comprises a mono (metal) phosphate, wherein the metal is selected from the group consisting of aluminum, zinc and a component prepared form a precursor resin.

5. A semiconductor device as claimed in claim 1, where the security coating has a thickness of less than 3 $\mu$m and the matrix of the security coating comprises monoaluminum-phosphate.

6. A semiconductor device as claimed in claim 1, further comprising a light-sensitive element and an element containing data, wherein the light-sensitive element and the element containing data are covered by the security coating and wherein the light-sensitive element, after the coating is damaged, reacts to exposure to visible light by inducing a permanent change of state of the element containing data.

7. A semiconductor device as claimed in claim 1, further comprising a light-sensitive element and an electrically programmable element containing data, wherein the light-sensitive element and the element containing data are covered by the security coating and the light sensitive element, after the coating is damaged, reacts to exposure to visible light by inducing erasure of the data and by bringing the electrically programmable element into a non-programmable state.

8. A smartcard provided with a semiconductor device comprising a memory and a security coating which comprises a powdery first filler that scatters at least visible light, said powdery first filler being incorporated in a matrix, wherein
   the coating comprises a second filler which is an absorber of radiation of a wavelength in the range of from 800 to 1400 nm, and
   the difference between the refractive index of the first filler and that of the matrix is at least 0.3; and wherein the second filler is present in a quantity of about an equal amount by weight as the first filler so as to transform radiation into heat and absorbs at least 99% of infrared radiation in contact therewith.

* * * * *